(12) United States Patent
Heo et al.

(10) Patent No.: US 11,010,582 B2
(45) Date of Patent: May 18, 2021

(54) TFT PANEL TYPE FINGERPRINT RECOGNITION SENSOR

(71) Applicant: VIEWORKS CO., LTD., Anyang-Si (KR)

(72) Inventors: Kang Heo, Yongin-si (KR); Hoo Shik Kim, Uiwang-si (KR)

(73) Assignee: VIEWORKS CO., LTD., Anyang-Si (KR)

( * ) Notice: Subject to any disclaimer, the term of this patent is extended or adjusted under 35 U.S.C. 154(b) by 267 days.

(21) Appl. No.: 16/088,633

(22) PCT Filed: Mar. 29, 2017

(86) PCT No.: PCT/KR2017/003380
§ 371 (c)(1),
(2) Date: Sep. 26, 2018

(87) PCT Pub. No.: WO2017/171380
PCT Pub. Date: Oct. 5, 2017

(65) Prior Publication Data
US 2020/0302141 A1   Sep. 24, 2020

(30) Foreign Application Priority Data

Mar. 31, 2016   (KR) .......................... 10-2016-0039317

(51) Int. Cl.
*G06K 9/00* (2006.01)
*H01L 29/786* (2006.01)

(52) U.S. Cl.
CPC .......... *G06K 9/0004* (2013.01); *H01L 29/786* (2013.01)

(58) Field of Classification Search
CPC . G06K 9/0004; G06K 9/00053; H01L 29/786
See application file for complete search history.

(56) References Cited

U.S. PATENT DOCUMENTS

| 2005/0157914 A1* | 7/2005 | Kim ...................... H01L 31/112 |
| | | 382/127 |
| 2010/0321341 A1* | 12/2010 | Cho ...................... H01L 31/028 |
| | | 345/175 |
| 2012/0182266 A1* | 7/2012 | Han ...................... G06F 3/0425 |
| | | 345/175 |

(Continued)

FOREIGN PATENT DOCUMENTS

| KR | 10-2003-0058719 A | 7/2003 |
| KR | 10-2006-0087704 A | 8/2006 |

(Continued)

OTHER PUBLICATIONS

International Search Report issued in PCT/KR2017/003380 dated Jul. 4, 2017 (2 pages).

(Continued)

*Primary Examiner* — Premal R Patel
(74) *Attorney, Agent, or Firm* — Osha Bergman Watanabe & Burton LLP

(57) ABSTRACT

The present invention relates to a TFT panel type fingerprint recognition sensor comprising: a total reflection unit for totally reflecting light emitted from a light source; a photodiode for detecting light reflected through the total reflection unit; and a TFT panel for processing voltage output from the photodiode so as to perform imaging.

17 Claims, 5 Drawing Sheets

100

(56) References Cited

U.S. PATENT DOCUMENTS

2014/0035879 A1* 2/2014 Su .......................... G06F 3/042
345/175
2016/0232397 A1* 8/2016 Yu ..................... G06K 9/00046

FOREIGN PATENT DOCUMENTS

| KR | 10-2010-0061393 A | 6/2010 |
| KR | 10-2014-0092398 A | 7/2014 |
| KR | 10-2015-0131944 A | 11/2015 |
| KR | 10-2016-0029697 A | 3/2016 |

OTHER PUBLICATIONS

Written Opinion of the International Searching Authority issued in PCT/KR2017/003380 dated Jul. 4, 2017 (7 pages).

* cited by examiner

TFT PANEL TYPE FINGERPRINT RECOGNITION SENSOR

TECHNICAL FIELD

The present invention relates to a thin film transistor (TFT) panel type fingerprint recognition sensor, and more specifically, to a TFT panel type fingerprint recognition sensor having a relatively simplified structure optically using a TFT panel and capable of imaging not only a fingerprint but also an inward area of a palm, which is not conventionally directly irradiated with light, using a thin film type total reflection sheet.

BACKGROUND ART

Generally, fingerprint recognition sensors are broadly classified into optical type fingerprint recognition sensors, contact light emitting type fingerprint recognition sensors, capacitance type fingerprint recognition sensors, and the like, and optical lenses are separately required to process optical type or contact light emitting type optical images so that there is difficulty in manufacturing the fingerprint recognition sensors in a thinned shape.

To improve such a difficulty, the capacitance type fingerprint recognition sensor is used and has an advantage in that since a fingerprint is detected using a voltage difference caused by a difference in capacitance formed by valleys and peaks of the fingerprint, an optical lens is unnecessary such that the capacitance type fingerprint recognition sensor can be manufactured in a thinned shape. However, when contaminants adhere to a surface of a capacitor due to a contact of the fingerprint on the surface thereof, there is a problem in that the capacitor may malfunction such that a fingerprint recognition rate may be degraded. Accordingly, the optical type fingerprint recognition sensor is currently widely used in a door lock or an access control system.

FIG. 1A is an exemplary diagram for describing the principle of a conventional optical type fingerprint recognition sensor, and FIG. 1B is an exemplary diagram illustrating of a product of the conventional optical type fingerprint recognition sensor.

As shown in FIG. 1A, the conventional optical type fingerprint recognition sensor is configured such that a light source emits light to an incident surface of a prism, and when a finger comes into contact with a reflective surface of the prism, the light reflected by flection of the fingerprint is output through an exit surface of the prism, and the light output from the prism is imaged at an image acquisition device (e.g., a complementary metal-oxide semiconductor (CMOS) sensor) via a lens.

Meanwhile, FIG. 2 is an exemplary diagram for describing the principle of a conventional palm recognition device. The conventional palm recognition device operates on a principle similar to the conventional optical type fingerprint recognition sensor. The conventional palm recognition device captures an image of a palm, which is put on an outer side of a glass, from an inner side of the glass using an image acquisition device (e.g., a CMOS sensor) and processes the captured palm image to recognize the palm (e.g., a hand shape including five fingers and lines of the palm).

In this case, the glass serves as only a pedestal for placing the palm or the fingers. In order to optically recognize an object (e.g., the fingerprint or the palm), a light source and a mechanism for installing the image capturing device should be further included under the pedestal such that there is a problem in that an overall volume of an object recognition device becomes larger as an object which will be recognized becomes larger.

Therefore, in order to minimize a volume of the object recognition device even when an object which will be recognized becomes larger, a recognition sensor for recognizing an entire fingerprint or palm should be manufactured in the form of a panel shape.

The background art of the present invention is disclosed in Korean Patent Laid-Open Publication No. 10-2006-0087704 (published on Aug. 3, 2006, entitled "Fingerprint Recognition Sensor and Fingerprint Recognition System Using the Same).

DISCLOSURE

Technical Problem

The present invention is directed to providing a thin film transistor (TFT) panel type fingerprint recognition sensor having a relatively simplified structure optically using a TFT panel and capable of imaging not only a fingerprint but also an inward area of a palm, which is not conventionally directly irradiated with light, using a thin film type total reflection sheet.

Technical Solution

One aspect of the present invention provides a thin film transistor (TFT) panel type fingerprint recognition sensor including a total reflection unit configured to totally reflect light emitted from a light source, a photodiode configured to sense light reflected from the total reflection unit, and a TFT panel configured to process a voltage output from the photodiode to perform imaging.

The total reflection unit may include a glass substrate serving as a light guide for total reflection.

The TFT panel type fingerprint recognition sensor may further include a glass substrate made of a material having a refractive index that is greater than that of air, an insulation layer disposed under the glass substrate, a dielectric layer formed under the insulation layer, a supporting glass formed under the dielectric layer, and a reflective sheet formed under the supporting glass, wherein the photodiode and the TFT panel may be disposed inside the dielectric layer.

An optimal thickness of the glass substrate may be formed by being selected in a range of 100 μm to 400 μm under a condition in which balance of durability and resolution is maintained.

The insulation layer may be formed to include at least one of silicon dioxide (nd=1.46), silicon nitride (nd=2), hafnium oxide (nd=1.9), aluminum oxide (nd=1.76), and yttrium oxide (nd=1.93).

The dielectric layer may be formed to include a fluoropolymer-based homopolymer or copolymer.

The light source may emit light in a visible ray band and may be formed to emit light from a lateral surface of the glass substrate.

The TFT panel may be formed under the glass substrate in a dielectric layer and formed on an insulation layer which is formed under the glass substrate, one electrode of the photodiode may be formed to be connected to the TFT panel, and the other electrode thereof may be formed to be connected to an electrode layer which applies a bias.

One electrode of the photodiode, which is connected to the TFT panel, may be formed as a transparent electrode, and the other electrode of the photodiode, which is connected to the electrode layer, may be formed as an opaque electrode.

The transparent electrode may be formed to include at least one of a metal mesh, a silver nanowire, indium tin oxide (ITO), antimony tin oxide (ATO), gallium zinc oxide (GZO), aluminum zinc oxide (AZO), indium zinc oxide (IZO), In/Ga-doped ZnO (IGZO), Mg-doped ZnO (MZO), Mo-doped ZnO, Al-doped MgO, Ga-doped MgO, F-doped $SnO_2$, Nb-doped $TiO_2$, $CuAlO_2$, a conductive polymer, a carbon nanotube, and graphene, and the opaque electrode may be formed to include at least one among Al, gold (Au), silver (Ag), copper (Cu), platinum (Pt), tungsten (W), nickel (Ni), Zn, titanium (Ti), zirconium (Zr), hafnium (Hf), cadmium (Cd), rhodium (Rh), iridium (Ir), cobalt (Co), tellurium (Te), molybdenum (Mo), iron (Fe), manganese (Mn), niobium (Nb), germanium (Ge), osmium (Os), vanadium (V), and lead (Pb).

The total reflection unit may include a passivation layer having an upper portion with which a transparent thin film is coated or to which a tampered glass is attached.

The TFT panel type fingerprint recognition sensor may further include a transparent thin film, a passivation layer disposed under the transparent thin film, a dielectric layer formed under the passivation layer, and a glass substrate formed under the dielectric layer, wherein the photodiode and the TFT panel may be disposed inside the dielectric layer.

An optimal thickness of the transparent thin film may be formed by being selected in a range of 50 μm to 500 μm under a condition in which balance of durability and resolution is maintained.

The transparent thin film may include at least one of aluminum oxide, zirconium oxide, titanium oxide, zinc oxide, cerium oxide, tantalum oxide, yttrium oxide, ytterbium oxide, silicon oxide, and alumina (Al2O3).

The light source may be formed at a lateral surface of the passivation layer or under the glass substrate.

An electrode layer may be disposed in the dielectric layer and disposed under the passivation layer, one electrode of the photodiode may be formed to be connected to the electrode layer, and the TFT panel may be formed to be connected to the other electrode of the photodiode.

One electrode of the photodiode, which is connected to the TFT panel, may be formed as an opaque electrode, and the other electrode of the photodiode, which is connected to the electrode layer, may be formed as a transparent electrode.

Advantageous Effects

A thin film transistor (TFT) panel type fingerprint recognition sensor according to an aspect of the present invention can have a relatively simplified structure optically using a TFT panel and can image not only a fingerprint but also an inward area of a palm, which is not conventionally directly irradiated with light, using a thin film type total reflection sheet.

BEST MODE

Figure 1A:
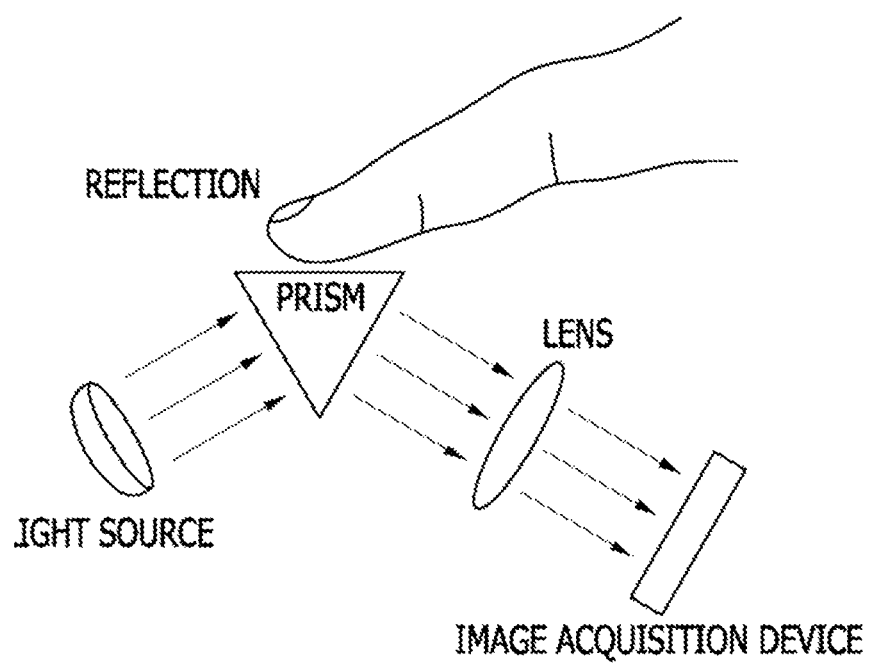
FIG. 1A is an exemplary diagram for describing the principle of a conventional optical type fingerprint recognition sensor.
Figure 1B:
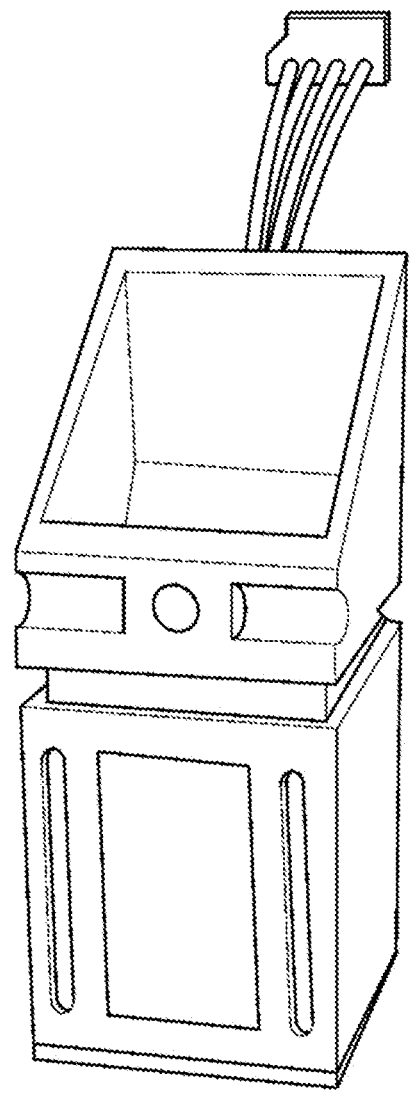
FIG. 1B is an exemplary diagram illustrating a product of the conventional optical type fingerprint recognition sensor.
Figure 2:
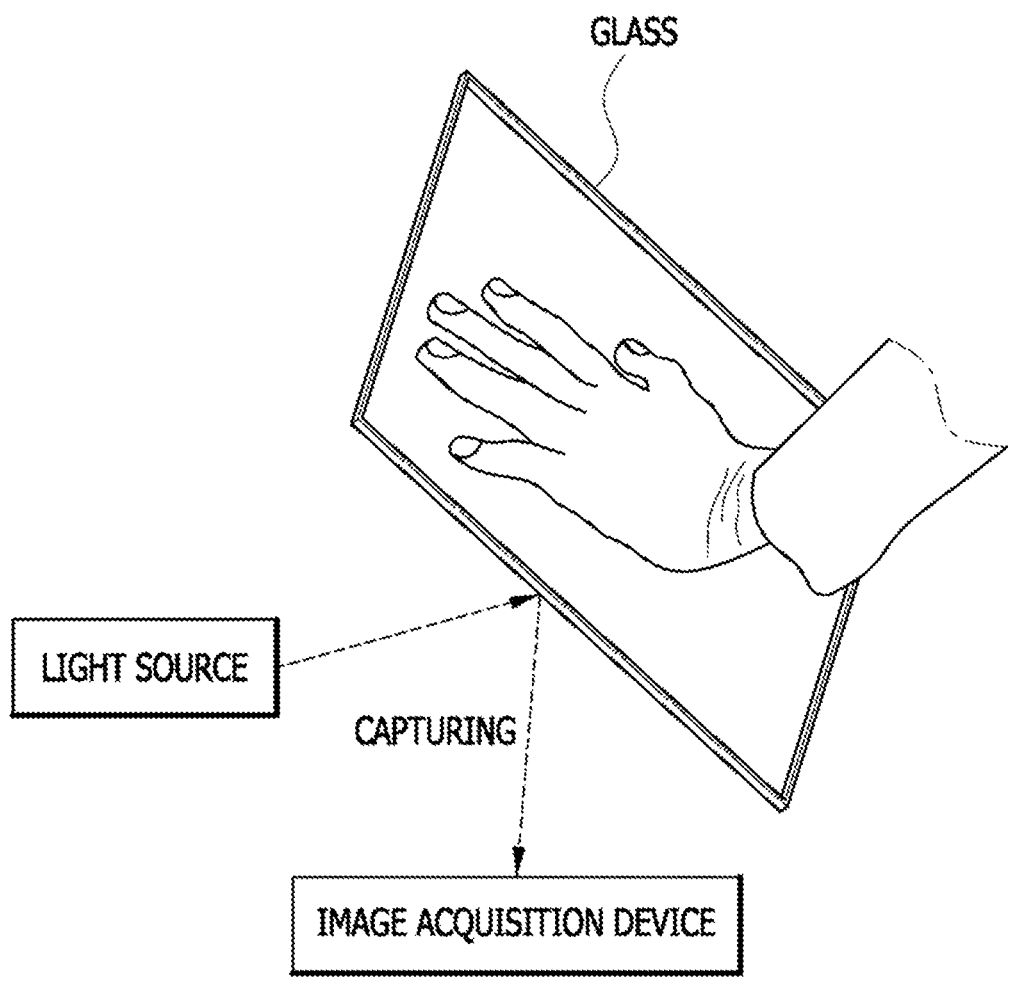
FIG. 2 is an exemplary diagram for describing the principle of a conventional palm recognition device.

Hereinafter, an exemplary embodiment of a thin film transistor (TFT) panel type fingerprint recognition sensor according to the present invention will be described with reference to the accompanying drawings.

In the following description, thicknesses of lines and sizes of components shown in the drawings may be exaggerated for clarity and convenience of description. In addition, the terms described below are defined in consideration of the functions of the present invention, and these terms may be varied according to the intent of a user or an operator or a custom. Therefore, the definitions of the terms used herein should follow contexts disclosed herein.

Modes of the Invention

Figure 3:
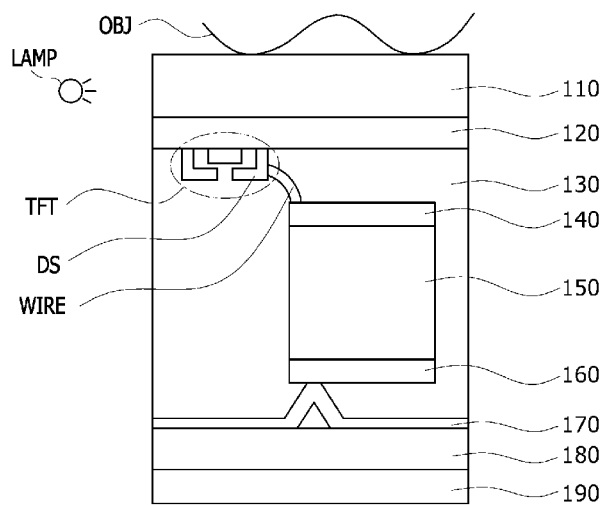
FIG. 3 is an exemplary diagram illustrating a pixel structure of a thin film transistor (TFT) panel type fingerprint recognition sensor according to a first embodiment of the present invention.

FIG. 3 is an exemplary diagram illustrating a pixel structure of a TFT panel type fingerprint recognition sensor according to a first embodiment of the present invention.

For reference, since the TFT panel type fingerprint recognition sensor according to the first embodiment shown in FIG. 3 has a pixel structure, when an object which will be recognized is substantially a finger or a palm, the TFT panel type fingerprint recognition sensor is disposed in a flat panel form to correspond to an area of the object.

As shown in FIG. 3, a fingerprint recognition sensor 100 according to the first embodiment of the present invention allows light emitted from a lateral light source LAMP (i.e., a lateral surface of a glass substrate) to pass through a glass substrate 110 at which a TFT panel (or a thin film transistor TFT) is formed to cause total internal reflection (TIR).

Further, when an object OBJ (e.g., a finger, a palm, or the like) comes into contact with an upper portion of the glass substrate 110, frustrated TIR (FTIR) light is received by a photodiode 150 to be imaged through the TFT panel (or the thin film transistor TFT).

Here, the imaging means a process of acquisition, storage, display, or print (or output) of an image. For example, in the fingerprint recognition sensor, the imaging means that the photodiode 150 outputs bright light (actually, a voltage corresponding to the bright light) in a state in which light is totally reflected, and when the object OBJ (e.g., a finger, a palm, or the like) comes into contact with the upper portion of the glass substrate 110, an FTIR portion (e.g., a fingerprint, a palm print, or the like) of the object OBJ is output with dark (actually, a voltage corresponding to the dark), thereby being imaged through the TFT panel (or the thin film transistor TFT). In order to image a finger or an entire palm, a pixel (i.e., a fingerprint recognition sensor) corresponding to an area of the finger or the entire palm should be arrayed.

Further, the FTIR means that a surface of a material having a higher refractive index approaches an interface having a lower refractive index, which causes total reflection, to make the total reflection incomplete.

Further, as shown in FIG. 3, the TFT panel type fingerprint recognition sensor according to the first embodiment has an advantage in that a structure of the fingerprint recognition sensor is significantly simplified using the glass substrate 110 of the TFT panel as a light guide for total reflection.

For example, a size of the TFT panel type fingerprint recognition sensor may be reduced by one fourth or more when compared to that of a commercially available prism type (or an optical type) palm fingerprint recognition device.

Further, the TFT panel type fingerprint recognition sensor according to the first embodiment may be combined with a light receiving element (e.g., the photodiode) and an optical device (e.g., a prism, a lens, and the like) as one unity to reduce unnecessary light propagation such that there is an effect of being capable of improving quality of an image.

As shown in FIG. 3, the TFT panel type fingerprint recognition sensor according to the first embodiment includes the glass substrate 110 made of a material having a refractive index higher than that of the outside (e.g., air), an insulation layer 120 (or an gate insulation film) disposed under the glass substrate 110, a dielectric layer 130 disposed under the insulation layer 120, a supporting glass 180 disposed under the dielectric layer 130, and a reflective sheet 190 disposed under the supporting glass 180.

Here, the glass substrate 110 preferably has a thickness in the range of 100 μm (at minimum) to 400 μm (at maximum) so as to minimize dispersion of light as a totally reflective layer, and an optimal thickness may be selected from the above-described range under a condition in which balance of durability and resolution may be maintained.

At this point, formation of total reflection between the glass substrate 110 and the insulation layer 120 is not an essential condition. However, in order to prevent a phenomenon in which light (or a ray) is totally reflected to reciprocate within the insulation layer 120, the insulation layer 120 is preferably formed to have a refractive index that is less than or equal to 1.52 which is a refractive index of the glass substrate 110.

For example, the insulation layer 120 may employ at least one of silicon dioxide (nd=1.46), silicon nitride (nd=2), hafnium oxide (nd=1.9), aluminum oxide (nd=1.76), and yttrium oxide (nd=1.93).

Meanwhile, as shown in the following Table 1, the dielectric layer 130 may employ a fluoropolymer-based homopolymer or a copolymer, and among the fluoropolymer-based homopolymer and copolymer, a material having a refractive index that is lower than that of the insulation layer 120 (or the gate insulation film) may be used, and in order to improve quality of an image by increasing transmittance of light, a material having transmittance as high as possible may be selected and used.

TABLE 1

| Homopolymers | Copolymers |
| --- | --- |
| PTFE (nd = 1.35) | FEP (nd = 1.344) |
| PCTFE (nd = 1.435) | ETFE (nd = 1.4) |
| PVDF (nd = 1.42) | ECTFE (nd = 1.447) |
|  | PFA (1.34) |
|  | THV (nd = 1.355) |
|  | THF (1.407) | further, the supporting glass 180 employs a tempered glass for structural stability, and the reflective sheet 190 is attached to a lowermost portion of the TFT panel type fingerprint recognition sensor 100 so as to prevent a phenomenon in which light incident from the light source LAMP exits to the outside from degrading light reception efficiency.

Furthermore, the light source LAMP employs a light source which emits light in a visible ray band and is not required to be configured to emit light to only the glass substrate 110. Alternatively, the light source LAMP is configured to emit light to a TFT area including the glass substrate.

Moreover, in the dielectric layer 130, a thin film transistor TFT is disposed at the insulation layer 120 formed under the glass substrate 110, the photodiode 150 of which one electrode is connected to the thin film transistor TFT is formed, and an electrode layer 170 is formed to be connected to the other electrode of the photodiode 150.

In this case, one terminal 140 (e.g., an anode) of the photodiode 150 is formed as a transparent electrode to be connected to one terminal DS (e.g., a drain or a source) of the thin film transistor TFT by a conductive line WIRE, and the other terminal 160 (e.g., a cathode) of the photodiode 150 is formed as an opaque electrode to be directly connected to the electrode layer 170 (or a bias application electrode) which is an opaque electrode identical to the opaque electrode 160.

Here, the transparent electrode 140 may be implemented including at least one of a metal mesh, a silver nanowire, indium tin oxide (ITO), antimony tin oxide (ATO), gallium zinc oxide (GZO), aluminum zinc oxide (AZO), indium zinc oxide (IZO), In/Ga-doped ZnO (IGZO), Mg-doped ZnO (MZO), Mo-doped ZnO, Al-doped MgO, Ga-doped MgO, F-doped SnO2, Nb-doped TiO2, CuAlO2, a conductive polymer, a carbon nanotube, and graphene, and the opaque electrode 160 may be implemented using at least one among Al, gold (Au), silver (Ag), copper (Cu), platinum (Pt), tungsten (W), nickel (Ni), Zn, titanium (Ti), zirconium (Zr), hafnium (Hf), cadmium (Cd), rhodium (Rh), iridium (Ir), cobalt (Co), tellurium (Te), molybdenum (Mo), iron (Fe), manganese (Mn), niobium (Nb), germanium (Ge), osmium (Os), vanadium (V), and lead (Pb).

Figure 4:
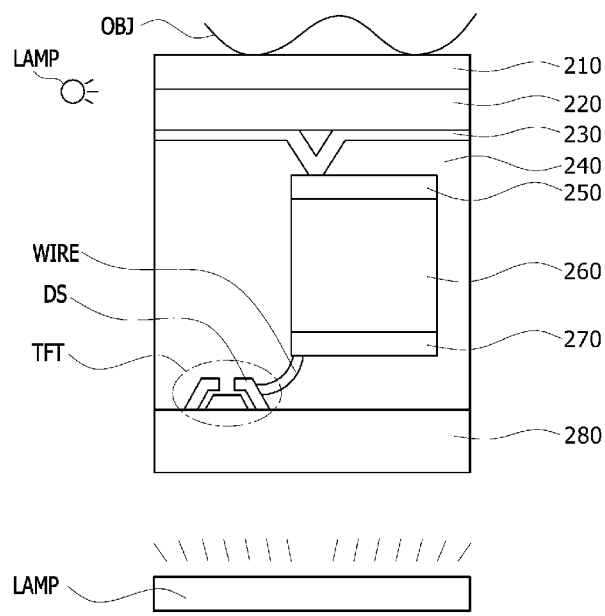
FIG. 4 is an exemplary diagram illustrating a pixel structure of a TFT panel type fingerprint recognition sensor according to a second embodiment of the present invention.

FIG. 4 is an exemplary diagram illustrating a pixel structure of a TFT panel type fingerprint recognition sensor according to a second embodiment of the present invention.

For reference, since the TFT panel type fingerprint recognition sensor shown in FIG. 4 has a pixel structure, when an object which will be recognized is substantially a finger or a palm, the TFT panel type fingerprint recognition sensor is disposed in a flat panel form to correspond to an area of the object.

As shown in FIG. 4, a fingerprint recognition sensor 200 according to the second embodiment of the present invention allows light emitted from a lateral light source LAMP (i.e., a lateral surface of a passivation layer) to pass through a passivation layer 220 made of a material having a refractive index that is lower than that of glass to make TIR, and a high hardness transparent thin film 210 is applied (or deposited) on the passivation layer 220 or a tempered glass is attached thereto such that the high hardness transparent thin film 210 or the tempered glass may be used as a total reflection layer.

Further, durability may be secured by applying (or depositing) the high hardness transparent thin film 210 on the passivation layer 220, or by adjusting a thickness of the passivation layer 220.

In this case, the high hardness transparent thin film 210 is preferably has a thickness in the range of 50 μm (at minimum) to 500 μm (at maximum), and an optimal thickness may be selected from the above-described range under a condition in which balance of durability and resolution may be maintained.

Further, a material of the high hardness transparent thin film 210 may employ at least one of aluminum oxide, zirconium oxide, titanium oxide, zinc oxide, cerium oxide, tantalum oxide, yttrium oxide, ytterbium oxide, silicon oxide, and alumina (Al2O3) as an inorganic oxide. Particularly, when alumina (Al2O3) is used as a material, it has an advantage in that a high hardness (e.g., 9H or more) may be obtained.

Further, when an object OBJ (e.g., a finger, a palm, or the like) comes into contact with an upper portion of the high hardness transparent thin film 210, FTIR light is received by a photodiode 260 to be imaged through the TFT panel (or the thin film transistor TFT). For example, in the fingerprint recognition sensor 200, the photodiode 260 outputs a bright light (actually, a voltage corresponding to the bright light) in a state in which light is totally reflected, and when the object OBJ (e.g., a finger, a palm, or the like) comes into contact with the upper portion of the high hardness transparent thin film 210, an FTIR portion (e.g., a fingerprint, a palm print, or the like) of the object OBJ is imaged by being output with dark (actually, a voltage corresponding to the dark).

Further, as shown in FIG. 4, the TFT panel type fingerprint recognition sensor 200 according to the second embodiment has an advantage in that a structure of the TFT panel type fingerprint recognition sensor 200 is significantly simplified by utilizing the high hardness transparent thin film 210 (or the tempered glass) deposited on the upper portion of the passivation layer 220 as a light guide for total reflection.

Furthermore, like the TFT panel type fingerprint recognition sensor 100 according to the first embodiment shown in FIG. 3, the TFT panel type fingerprint recognition sensor 200 according to the second embodiment has an advantage of reducing a size by one fourth or more when compared to the commercially available prism type (or optical type) palm fingerprint recognition device and may be combined with a light reception element (e.g., a photodiode) and an optical device (e.g., a prism, a lens, and the like) as one unity to reduce unnecessary light propagation such that there is an effect of improving quality of an image.

More specifically, as shown in FIG. 4, the TFT panel type fingerprint recognition sensor 200 according to the second embodiment of the present invention includes the high hardness transparent thin film 210, the passivation layer 220 disposed under the transparent thin film 210, a dielectric layer 240 disposed under the passivation layer 220, and a glass substrate 280 disposed under the dielectric layer 240.

In this case, the light source LAMP may employ a light source which emits light in a visible ray band and may be formed at a lateral surface of the passivation layer 220 or under the glass substrate 280.

As shown in Table 1, the dielectric layer 240 may employ the fluoropolymer-based homopolymer or copolymer. Among the fluoropolymer-based homopolymer and copolymer, a material having transmittance as high as possible is selected and used as the dielectric layer 240 so as to improve quality of an image by increasing transmittance.

Further, in the dielectric layer 240, an electrode layer 230 (or a bias application electrode) is disposed under the passivation layer 220, the photodiode 260 of which one electrode is connected to the electrode layer 230 is formed, and the TFT panel (or the thin film transistor TFT) is formed to be connected to the other electrode of the photodiode 260.

In this case, one terminal 270 (e.g., an anode) of the photodiode 260 is formed as an opaque electrode to be connected to one electrode DS (e.g., a drain or a source) of the TFT panel (or the thin film transistor TFT) by a conductive line WIRE, and the other electrode 250 (e.g., a cathode) of the photodiode 260 is formed as a transparent electrode to be directly connected to the electrode layer 230 which is a transparent electrode identical to the transparent electrode 250.

For reference, when compared to the fingerprint recognition sensor 100 according to the first embodiment shown in FIG. 3, in the fingerprint recognition sensor 200 according to the second embodiment shown in FIG. 4, an upper side and a lower side of a panel are switched such that positions of the transparent electrode and the opaque electrode are vertically switched That is, the electrode layer 230 (i.e., the bias application electrode) formed under the passivation layer 220 becomes the transparent electrode, and the electrode 270 connected to the photodiode 260 and the TFT panel (or the thin film transistor TFT) becomes the opaque electrode.

Here, the transparent electrode 230 may be implemented including at least one of a metal mesh, a silver nanowire, ITO, ATO, GZO, AZO, IZO, IGZO, MZO, Mo-doped ZnO, Al-doped MgO, Ga-doped MgO, F-doped $SnO_2$, Nb-doped $TiO_2$, $CuAlO_2$, a conductive polymer, a carbon nanotube, and graphene, and the opaque electrode 270 may be implemented using at least one among Al, Au, Ag, Cu, Pt, W, Ni, Zn, Ti, Zr, Hf, Cd, Rh, Ir, Co, Te, Mo, Fe, Mn, Nb, Ge, Os, V, and Pb.

While the present invention has been described with reference to the exemplary embodiments shown in the drawings, these are merely illustrative, and those skilled in the art to which the present invention pertains will understood that various modifications and equivalent other embodiments can be implemented within the spirit and scope of the invention. Therefore, the technical scope of the present invention should be defined by the appended claims.

The invention claimed is:

1. A thin film transistor (TFT) panel type fingerprint recognition sensor comprising:
    a total reflection unit configured to totally reflect light emitted from a light source;
    a photodiode configured to sense light reflected from the total reflection unit; and
    a TFT panel configured to process a voltage output from the photodiode to perform imaging,
    wherein the photodiode and the TFT panel are formed inside a dielectric layer disposed under the total reflection unit.

2. The TFT panel type fingerprint recognition sensor of claim 1, wherein the total reflection unit includes a glass substrate serving as a light guide for total reflection.

3. The TFT panel type fingerprint recognition sensor of claim 1, further comprising:
    a glass substrate made of a material having a refractive index that is greater than that of air;
    an insulation layer disposed under the glass substrate;
    a supporting glass disposed under the insulation layer; and
    a reflective sheet formed under the supporting glass,
    wherein the dielectric layer is formed between the insulation layer and the supporting glass.

4. The TFT panel type fingerprint recognition sensor of claim 3, wherein an optimal thickness of the glass substrate is formed by being selected in a range of 100 μm to 400 μm under a condition in which balance of durability and resolution is maintained.

5. The TFT panel type fingerprint recognition sensor of claim 3, wherein the insulation layer is formed to include at least one selected from a group consisting of silicon dioxide (nd=1.46), silicon nitride (nd=2), hafnium oxide (nd=1.9), aluminum oxide (nd=1.76), and yttrium oxide (nd=1.93).

6. The TFT panel type fingerprint recognition sensor of claim 3, wherein the dielectric layer is formed to include fluoropolymer-based homopolymer or copolymer.

7. The TFT panel type fingerprint recognition sensor of claim 1, wherein the light source emits light in a visible ray band and is formed to emit light from a lateral surface of a glass substrate.

8. The TFT panel type fingerprint recognition sensor of claim 1, wherein:
the TFT panel is formed in a dielectric layer and formed on an insulation layer which is formed under a glass substrate; and
one electrode of the photodiode is formed to be connected to the TFT panel and the other electrode thereof is formed to be connected to an electrode layer which applies a bias.

9. The TFT panel type fingerprint recognition sensor of claim 8, wherein:
one terminal of the photodiode, which is connected to the TFT panel, is formed as a transparent electrode; and
the other terminal of the photodiode, which is connected to the electrode layer, is formed as an opaque electrode.

10. The TFT panel type fingerprint recognition sensor of claim 9, wherein:
the transparent electrode is formed to include at least one selected from a group consisting of a metal mesh, a silver nanowire, indium tin oxide (ITO), antimony tin oxide (ATO), gallium zinc oxide (GZO), aluminum zinc oxide (AZO), indium zinc oxide (IZO), In/Ga-doped ZnO (IGZO), Mg-doped ZnO (MZO), Mo-doped ZnO, Al-doped MgO, Ga-doped MgO, F-doped $SnO_2$, Nb-doped $TiO2$, $CuAlO_2$, a conductive polymer, a carbon nanotube, and graphene; and
the opaque electrode is formed to include at least one selected from a group consisting of Al, gold (Au), silver (Ag), copper (Cu), platinum (Pt), tungsten (W), nickel (Ni), Zn, titanium (Ti), zirconium (Zr), hafnium (Hf), cadmium (Cd), rhodium (Rh), iridium (Ir), cobalt (Co), tellurium (Te), molybdenum (Mo), iron (Fe), manganese (Mn), niobium (Nb), germanium (Ge), osmium (Os), vanadium (V), and lead (Pb).

11. The TFT panel type fingerprint recognition sensor of claim 1, wherein the total reflection unit includes a passivation layer having an upper portion with which a transparent thin film is coated or to which a tampered glass is attached.

12. The TFT panel type fingerprint recognition sensor of claim 1, further comprising:
a transparent thin film;
a passivation layer formed under the transparent thin film; and
and
a glass substrate disposed under the passivation layer,
wherein the dielectric layer is formed between the passivation layer and the glass substrate.

13. The TFT panel type fingerprint recognition sensor of claim 12, wherein an optimal thickness of the transparent thin film is formed by being selected in a range of 50 μm to 500 μm under a condition in which balance of durability and resolution is maintained.

14. The TFT panel type fingerprint recognition sensor of claim 12, wherein the transparent thin film includes at least one selected from a group consisting of aluminum oxide, zirconium oxide, titanium oxide, zinc oxide, cerium oxide, tantalum oxide, yttrium oxide, ytterbium oxide, silicon oxide, and alumina ($Al_2O_3$).

15. The TFT panel type fingerprint recognition sensor of claim 12, wherein the light source is formed at a lateral surface of the passivation layer or under the glass substrate.

16. The TFT panel type fingerprint recognition sensor of claim 12, wherein:
an electrode layer is formed in the dielectric layer and formed under the passivation layer;
one electrode of the photodiode is formed to be connected to the electrode layer; and
the TFT panel is formed to be connected to the other electrode of the photodiode.

17. The TFT panel type fingerprint recognition sensor of claim 16, wherein:
one terminal of the photodiode, which is connected to the TFT panel, is formed as an opaque electrode; and
the other terminal of the photodiode, which is connected to the electrode layer, is formed as a transparent electrode.

* * * * *